United States Patent [19]

Lee

[11] Patent Number: 5,334,278
[45] Date of Patent: Aug. 2, 1994

[54] LIQUID-PHASE EPITAXY GROWTH SYSTEM AND METHOD FOR GROWING EPITAXIAL LAYER

[75] Inventor: Song J. Lee, Suweon, Rep. of Korea

[73] Assignee: Samsung Electronics Co., Ltd., Suweon, Rep. of Korea

[21] Appl. No.: 752,856

[22] Filed: Aug. 30, 1991

[30] Foreign Application Priority Data

May 16, 1991 [KR] Rep. of Korea .............. 91-7955

[51] Int. Cl.$^5$ .............................. C30B 19/06
[52] U.S. Cl. .............................. 117/57; 437/92; 437/117; 437/119; 437/120; 437/122
[58] Field of Search ........... 156/622, 624; 437/92, 437/117, 119, 120, 122

[56] References Cited

U.S. PATENT DOCUMENTS

| | | | |
|---|---|---|---|
| 3,890,194 | 6/1975 | Ettenberg | 156/622 |
| 3,960,618 | 6/1976 | Kawamura et al. | 437/122 |
| 4,110,133 | 8/1978 | Garrett et al. | 437/120 |
| 4,404,730 | 9/1983 | Heimen | 437/122 |
| 4,470,368 | 9/1984 | Reynolds et al. | 437/119 |
| 4,547,230 | 10/1985 | Hawrylo | 156/622 |

FOREIGN PATENT DOCUMENTS

| | | | |
|---|---|---|---|
| 52-52570 | 4/1977 | Japan | 437/122 |
| 3-9536 | 1/1991 | Japan | 156/622 |

*Primary Examiner*—Robert Kunemund
*Attorney, Agent, or Firm*—Ladas & Parry

[57] ABSTRACT

The liquid-phase epitaxy system having the LPE boat consists of of a slider section, a source holder section, and a contacting well section, in which the distance between the first two contacting wells is different from that between the first two source holding wells, so that the concentration of the solutions can be controlled by the proper temperature profile, since the solution for melt-etch and the remaining solution for the epitaxial growth are not filled into the contacting wells at the same time.

Thus, the present invention can easily perform the in-situ melt-etch and can improve the quality of the epitaxial layer and the epitaxial yield by minimizing the contamination of the melt-etched surface of the substrate.

7 Claims, 2 Drawing Sheets

LIQUID-PHASE EPITAXY GROWTH SYSTEM AND METHOD FOR GROWING EPITAXIAL LAYER

The present invention is related to LPE (Liquid Phase Epitaxy) system and a method for growing high-quality epitaxial layers by means of in-situ melt-etch (or meltback).

The LPE which is commercially very important to grow opto-electronic devices such as laser diodes and LEDs involves the precipitation of a material from a supersaturated solution onto a substrate of similar crystalline structure to that of the precipitate.

The advantages of the LPE which was first introduced by H. Nelson in 1963 are its simplicity, low cost, good reproducibility, and low dislocation density of grown epitaxial films FIG. 1 shows a cross-sectional view of a conventional LPE boat.

The LPE boat consists of a slider section 1, a contact well section 3, and a source holder section 5.

A substrate is loaded into a substrate slot 7 formed at a predetermined position of the slider section 1. Various sources are loaded into source holding wells $9a \sim 9e$ formed at the source holder section 5.

Homogenized melts in the source holding wells $9a \sim 9e$ are dropped into contacting wells $11a \sim 11e$ formed in the contacting well section 3.

The loaded substrate 15 is made contact with contacting melts $13a \sim 13e$ sequentially. In general, in the conventional LPE boat, the distance between neighboring source holding wells is same as that of its corresponding neighboring contacting wells.

The growth procedure of the epitaxial layers using the conventional LPE is described below.

First, source materials $13a \sim 13e$ are loaded into the source holding wells $9a \sim 9e$.

After dissolving the sources $13a \sim 13e$ by heating, the source holding wells $9a \sim 9e$ are aligned with the contacting wells $11a \sim 11e$ by pulling the source holder section 5. Then, that contacting wells $11a \sim 11e$ are simultaneously filled with the dissolved source, that is, solutions $13a \sim 13e$ in the source holding wells $9a \sim 9e$.

Next, the remaining melts in the source holding wells $9a \sim 9e$ are separated from those in the contacting wells $11a \sim 11e$ by pushing the source holding section 5 back to its original position.

After lowering the boat temperature, holder 7 is placed under the first contacting well $11a$ by pulling the slider section 1.

One of the conventional approaches to use melt-etch is to prepare undersaturated solution usually in the first contacting well $11a$ by accurately controlling the amount of the saturation source $13a$, for instance, polycrystalline GaAs loaded in the first source holding well $9a$. However, it is very difficult to adjust the amount of clean polycrystalline saturation source, since the amount of the saturation source is subject to change during either cleaning or etching. Furthermore, the cleaned saturation source is easily contaminated during measuring the weight of the sources.

Another approach to prepare the undersaturated solution is to raise the melt temperature until the desired undersaturation of the solution is reached. In this case, after the melt-etch is performed, the substrate wait until the desired supersaturation of the growth solutions is achieved by lowering the melt temperature. However, during the waiting period, the fresh melt-etched surface may be recontaminated due to the exposure to the growth environment.

SUMMARY OF THE INVENTION

An object of the present invention is to provide an LPE boat which doesn't need to control the amount of the saturation source accurately in order to prepare undersaturated solution for in-situ melt-etch.

Another object of the present invention is to provide an LPE growth method in which the melt-etch and growth can be performed sequentially without any interruption, and thus, the in-situ contamination is prevented resulting in high quality epitaxial films.

Still another object of the present invention is to provide an LPE growth method, in which both the undersaturation of the melt-etch solution and the supersaturation of the growth solution can be controlled very accurately, and therefore, the overall process will be reliable and reproducible.

According to one aspect of the present invention, there is provided an LPE boat comprising:

a slider section with a substrate slot where a substrate is loaded, a source holder section with source holding wells, and a contacting well section a plurality of contacting wells, of which one is filled with undersaturated solution for melt-etch and the others are filled with growth solutions, the contacting wells being disposed in such a manner that the distance between the first two contacting wells is different from that between the first two source holding wells.

According to another aspect of the present invention, there is provided an LPE growth method comprising the steps of:

dissolving sources for both melt-etch wells and growth wells at a temperature $T_1$;

filling a first contacting well with a solution for melt-etch by pushing the source holding section;

filling the rest contacting wells by pulling the source holder section after homogenizing enough the melts at the temperature $T_1$, then raising the temperature to $T_2$;

pulling the source holder section to the end position after homogenizing enough the melts in order to separate the melts in the contacting wells from the melts in the source holding wells;

lowering the melt temperature to $T_3$;

placing the substrate under the first contacting well by pulling the slider section and performing melt-etch of appropriate thickness; and growing epitaxial layers by contacting the substrate with next melts sequentially.

BRIEF DESCRIPTION OF THE DRAWINGS

These and other objects, features, and advantages of the present invention will become more clear from the following description for the preferred embodiments taken in conjunction with the accompanying drawings, in which.

DETAILED DESCRIPTION OF THE INVENTION

The present invention will now be described in more detail with reference to the accompanying drawings.

Figure 1:
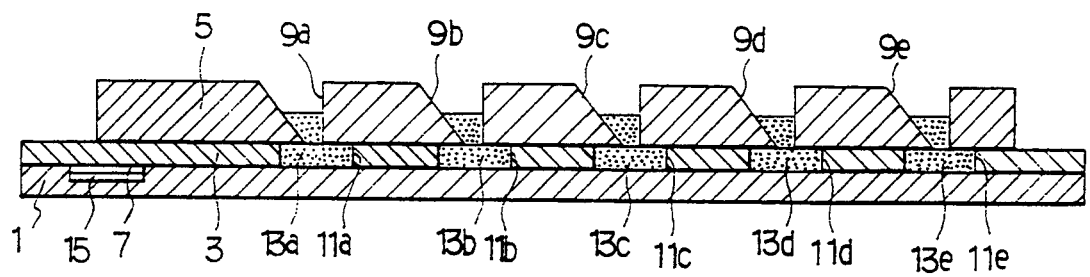
FIG. 1 is a cross-sectional view of a conventional LPE boat.
Figure 2:
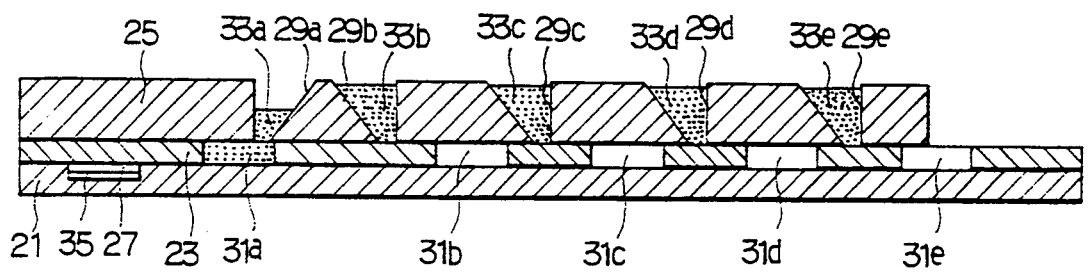
FIG. 2 is a cross-sectional view of a LPE boat according to the present invention.

FIG. 2 shows a cross-sectional view of a LPE boat according to the present invention. In FIG. 2, the LPE boat consist of a slider section 21, a contact well section 23, and a source holder section 25. A substrate slot 27, in which a substrate 35 is loaded, is formed at a predetermined position of the slider section 21. Also, source holding wells 29a~29e are formed in the source holder section 25 to be filled with sources 33a~33e. Contact wells 31a~31e are formed in the contact well section 23.

Figure 4A:
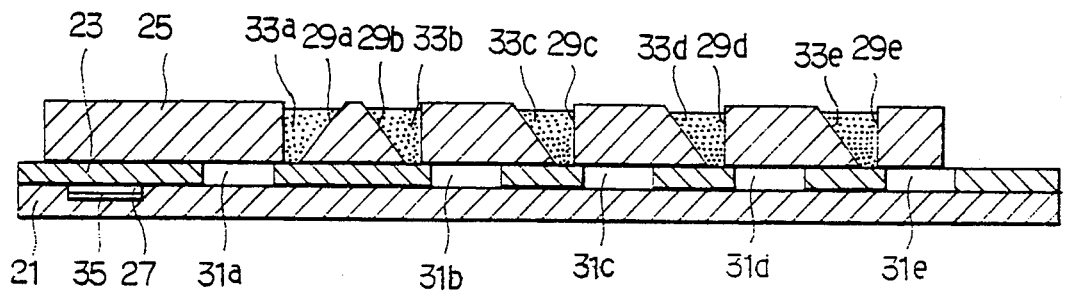
FIGS. 4(A)~4(D) are cross-sectional views of the LPE boat to explain the growth procedure according to the present invention.
Figure 4B:
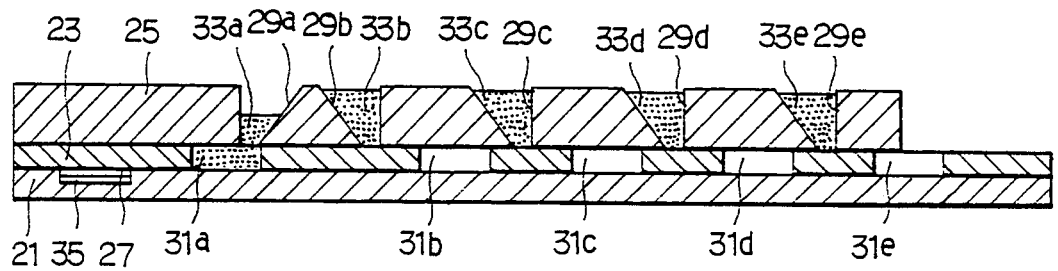
Figure 4C:
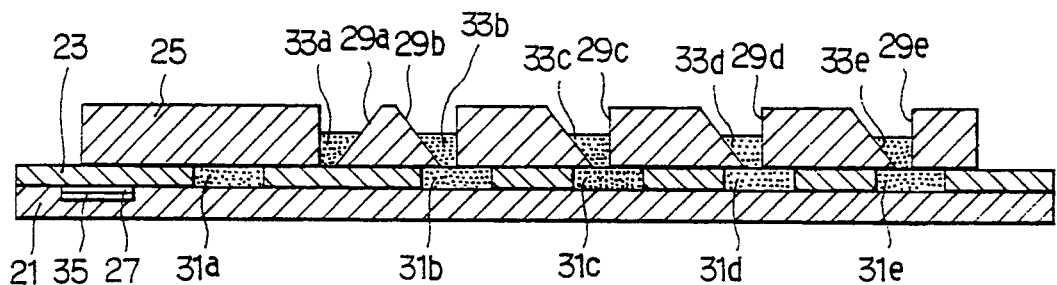

The distance between the first two source holding wells 29a~29b is smaller than that between the first two contacting wells, 31a~31b so that only the first contacting well 31a can be filled with a melt as shown in FIG. 4(B). The other contacting wells 31b~31e are filled with melts at different stages as shown in FIG. 4(C).

Thus, the equilibrium concentration of the solution filled in the first contacting well 31a can be independently controlled of the equilibrium concentration of the solutions filled in the other contacting wells 31b~31c.

Figure 3:
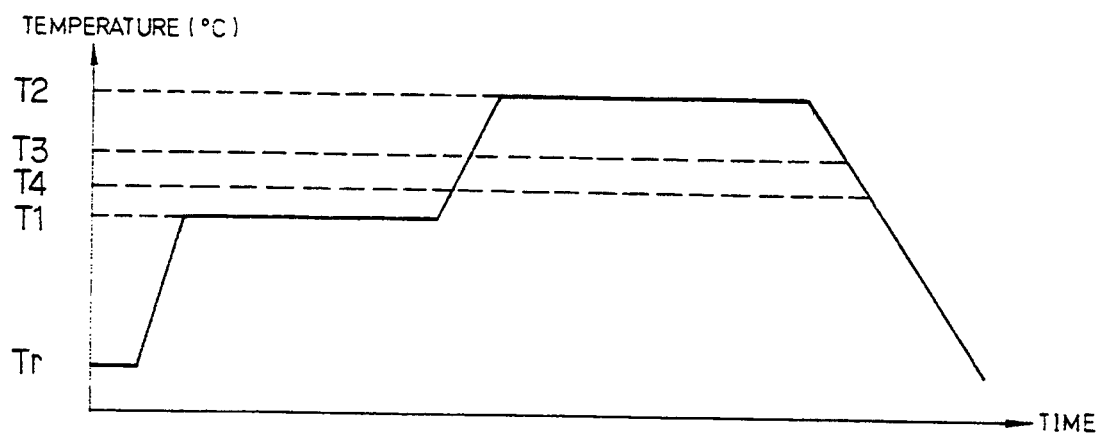
FIG. 3 is a temperature profile during the growth of epitaxial layers by using the boat according to the present invention.

FIG. 3 shows a temperature profile for growing epitaxial layers according to the present invention.

In FIG. 3, Tr represents the room temperature, $T_1$ represents a temperature for homogenizing the solution filled in the first contacting well 31a, $T_2$ represents a temperature for homogenizing the solutions filled in the other contacting wells 31b~31e, $T_3$ represents a temperature for performing the melt-etch of the substrate 35 by the undersaturated solution in the first contacting well 31b, and $T_4$ represents a temperature for beginning the growth of the epitaxial layers.

FIGS. 4(A)~4(D) show cross-sectional views of the LPE boat to explain the growth procedure.

Referring to FIG. 4(A), the solutions 33a~33e in the source holding wells 29a~29b are in equilibrium condition at the temperature $T_1$.

Referring to FIG. 4(B), the solution 33a in the first source holding well 29a is filled into the first contacting well 31a by pushing the source holder section 25, where the remaining solutions 33b~33e are not filled into the contact wells 31b~31e yet. Then, the solution 33a in the first contact well 31a is sufficiently homogenized at the temperature $T_1$.

Referring to FIG. 4(C), the solutions 33b~33e are filled into the remaining contacting wells 31b~31e by pulling the source holder section 25, where the first source holding well 29a is separated from the first contacting well 31a. Then, the solutions 33b~33e in the contacting wells 31b~31e are sufficiently homogenized at the raised temperature $T_2$, where the first solution in the first contacting well 31a is undersaturated.

Figure 4D:
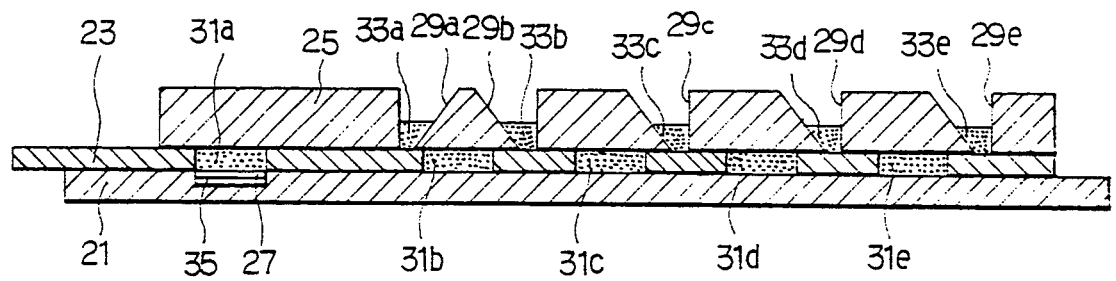

Referring to FIG. 4(D), the source holding wells 29a~29e are separated from the contacting wells 31a~31e by pulling the source holder section 25 as shown in FIG. 4(C). Subsequently, the temperature is lowered to $T_3$ so that the solution in the first contacting well 31a is maintained in a proper undersaturation state.

By pulling the slider section 21, the substrate 35 is placed under the first contacting well 31. Then, the undersaturated solution in the first contacting well 31a performs the in-situ melt-etch of the substrate 35. At this time, the solutions in the remaining contacting wells 31b~31e are in the supersaturation state.

Subsequently, the degree of the supersaturation of the solutions in the contacting wells 31b~31e increases as the temperature is lowered to the temperature $T_4$ during melt-etch. After the melt-etch is finished, the substrate 35 is made contact with the remaining solutions sequentially.

In the LPE boat as mentioned above, the equilibrium concentration of the solution for melt-etch can be independently controlled of the equilibrium concentration of the solutions for epitaxial growth of layers by proper temperature profile, and thus the undersaturation of the solution for melt-etch can be very accurately controlled.

Furthermore, the epitaxial growth can be performed immediately after the melt-etch without any interruption and, therefore, in-situ contamination of the melt-etched surface is minimized. As a result, the quality of the epitaxial layers would be improved drastically.

The invention is in no way limited to the embodiment described hereinabove. Various modifications of the disclosed embodiment as well as other embodiments of the invention will become apparent to persons skilled in the art upon reference to the description of the invention. It is, therefore, contemplated that the appended claims will cover any such modifications or embodiments as fall within the true scope of the invention.

What is claimed is:

1. A liquid-phase epitaxy growing method using a boat comprising a slider section including a slot for receipt of a substrate, a contacting well section containing a plurality of spaced apart contacting wells for selectively contacting solutions within said contacting wells with said substrate, a source holder section containing a plurality of source wells for selectively transferring solutions within said source wells to said contacting wells, and means for controllably heating said boat and materials contained therewithin to selected temperatures, the method comprising:

forming solutions by dissolving, at a temperature $T_1$, a source for a melt-etch within one of said source wells, and various sources for expitaxial growths in others of said source wells, during a first time period, at said temperature $T_1$, transferring a solution to one only of said contacting wells, said solution being melt-etch solution from said one source well, then, separating said one contacting well from said one source well for isolating said transferred melt-etch solution from said one source well, then, while maintaining the isolation of said melt-etch solution from said one source well, transferring, at a temperature $T_2$, solutions from said others of said source wells to respective ones of said contacting wells, then, separating said others of said contacting wells from their respective source wells for isolating the contents of all of said contacting wells from all of said source wells, then, while lowering the temperature from $T_2$, contacting said substrate with the melt-etch solution within said one contacting well for performing in situ melt-etching of said substrate during a time period beginning when the temperature reaches a temperature $T_3$, which is higher than $T_1$ and growing successive epitaxial layers on said substrate by successively contacting said substrate with solutions from said others of said contacting wells during a time period starting when the temperature reaches a temperature $T_4$ which is less than $T_3$.

2. The method according to claim 1, wherein the temperature is continuously lowered at a constant rate for growing the epitaxial layers and performing said in situ melt-etch.

3. The method according to claim 1, wherein said step of transferring the solutions from said others of said source wells is performed after increasing the temperature from $T_1$ and stabilizing the temperature at $T_2$.

4. The method according to claim 1, wherein the temperatures of $T_1$, $T_2$, $T_3$ and $T_4$ are in the relation of $T_2 > T_3 > T_4 > T_1$.

5. The method according to claim 1, wherein said solution for the melt-etch is in the equilibrium state at $T_1$.

6. The method according to claim 1, wherein said solution for melt-etch is in undersaturation state at $T_2$.

7. The method according to claim 1, wherein said solutions for the epitaxial growth are in the supersaturation state at $T_4$.

* * * * *